United States Patent
Ochiai et al.

(10) Patent No.: US 12,228,830 B2
(45) Date of Patent: Feb. 18, 2025

(54) DISPLAY DEVICE

(71) Applicant: Japan Display Inc., Tokyo (JP)

(72) Inventors: Takahiro Ochiai, Tokyo (JP); Hiroshi Inamura, Tokyo (JP); Keita Sasanuma, Tokyo (JP); Kengo Shiragami, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 462 days.

(21) Appl. No.: 17/572,638

(22) Filed: Jan. 11, 2022

(65) Prior Publication Data

US 2022/0128851 A1   Apr. 28, 2022

Related U.S. Application Data

(63) Continuation of application No. 16/207,436, filed on Dec. 3, 2018, now Pat. No. 11,249,363.

(30) Foreign Application Priority Data

Dec. 4, 2017  (JP) ................. 2017-232682

(51) Int. Cl.
  *G02F 1/1362*  (2006.01)
  *H01L 27/12*  (2006.01)
  (Continued)

(52) U.S. Cl.
  CPC .. *G02F 1/136218* (2021.01); *G02F 1/136254* (2021.01); *G02F 1/136286* (2013.01); *H01L 27/1218* (2013.01); *G01R 31/2825* (2013.01); *G02F 1/13439* (2013.01); *G02F 1/13454* (2013.01); *G02F 1/1368* (2013.01); *H01L 27/124* (2013.01); *H01L 27/1248* (2013.01); *H01L 29/78633* (2013.01)

(58) Field of Classification Search
  None
  See application file for complete search history.

(56) References Cited

U.S. PATENT DOCUMENTS 6,882,378 B2 *  4/2005  Nagata ............. G02F 1/136259
                                          349/139
8,269,939 B2 *  9/2012  Chiou .................... G09G 3/006
                                          349/149

(Continued)

FOREIGN PATENT DOCUMENTS

JP   2006-323097 A   11/2006

OTHER PUBLICATIONS

English translation of Office Action issued on Nov. 16, 2021, in corresponding Japanese Patent Application No. 2017-232682, 6 pages.

*Primary Examiner* — Dung T Nguyen
(74) *Attorney, Agent, or Firm* — XSENSUS LLP (57) ABSTRACT

According to one embodiment, a display device includes a first line which is arranged across a display portion, and includes a first end portion and a second end portion located at a non-display portion such that the display portion is located between the first and second end portions, a first switch electrically connected to the first end portion, a second switch electrically connected to the second end portion, a first terminal electrically connected to the first end portion via the first switch, and a second terminal electrically connected to the second end portion via the second switch.

7 Claims, 9 Drawing Sheets

(51) Int. Cl.
*G01R 31/28* (2006.01)
*G02F 1/1343* (2006.01)
*G02F 1/1345* (2006.01)
*G02F 1/1368* (2006.01)
*H01L 29/786* (2006.01)

(56) References Cited

U.S. PATENT DOCUMENTS

| | | |
|---|---|---|
| 2007/0296453 A1 | 12/2007 | Ootaguro et al. |
| 2014/0191930 A1 | 7/2014 | Okumoto |
| 2015/0301415 A1* | 10/2015 | Sawada ............. G02F 1/134336 349/147 |
| 2022/0004067 A1* | 1/2022 | Sasanuma ......... G02F 1/136254 |

* cited by examiner

DISPLAY DEVICE

CROSS-REFERENCE TO RELATED APPLICATIONS

This application is a continuation of U.S. application Ser. No. 16/207,436, filed Dec. 3, 2018, which is based upon and claims the benefit of priority from Japanese Patent Application No. 2017-232682, filed Dec. 4, 2017, the entire contents of each are incorporated herein by reference.

FIELD

Embodiments described herein relate generally to a display device.

BACKGROUND

In order to ensure the reliability of a display device, technologies for inspecting the display device have been considered variously. In one example, a technology of providing a switching element for inspection at a gap in a mounting area for an IC chip so as to check whether there exists a break or short-circuit in a signal line has been known.

Incidentally, recently, in accordance with enabling high definition in display devices, there is a tendency of an increase in the number of lines, and thinning of each line. In the line, at a part where a width of the line is reduced locally, a break of the line may occur due to stress caused by a flow of a driving current. For this reason, it is required to select a display device which may cause a break with an elapse of driving time before such a display device is put on the market.

DETAILED DESCRIPTION

In general, according to one embodiment, a display device includes: a first line which is arranged across a display portion, and includes a first end portion and a second end portion located at a non-display portion such that the display portion is located between the first end portion and the second end portion; a first switch electrically connected to the first end portion; a second switch electrically connected to the second end portion; a first terminal electrically connected to the first end portion via the first switch; and a second terminal electrically connected to the second end portion via the second switch.

According to another embodiment, a display device includes: a first line which is arranged across a display portion, and includes a first end portion and a second end portion located at a non-display portion such that the display portion is located between the first end portion and the second end portion; a second line which is adjacent to the first line, and includes a third end portion and a fourth end portion located at the non-display portion such that the display portion is located between the third end portion and the fourth end portion; a first switch configured to electrically connect the first end portion and the fourth end portion; a second switch electrically connected to the second end portion; a third switch electrically connected to the third end portion; a first terminal electrically connected to the third end portion via the third switch; and a second terminal electrically connected to the second end portion via the second switch.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated in the drawings schematically, rather than as an accurate representation of what is implemented. However, such schematic illustration is merely exemplary, and in no way restricts the interpretation of the invention. Further, in the specification and drawings, structural elements which function in the same or a similar manner to those described in connection with preceding drawings are denoted by like reference numbers, and redundant detailed description thereof is omitted unless necessary.

In the present embodiment, a liquid crystal display device is explained as an example of a display device DSP. Note that the main structures disclosed in the present embodiment are applicable to display devices such as a self-luminous display device with organic electroluminescent display elements and the like, an electronic paper-type display device with electrophoretic elements and the like, a display device employing micro-electromechanical systems (MEMS), and a display device employing electrochromism.

Figure 1:
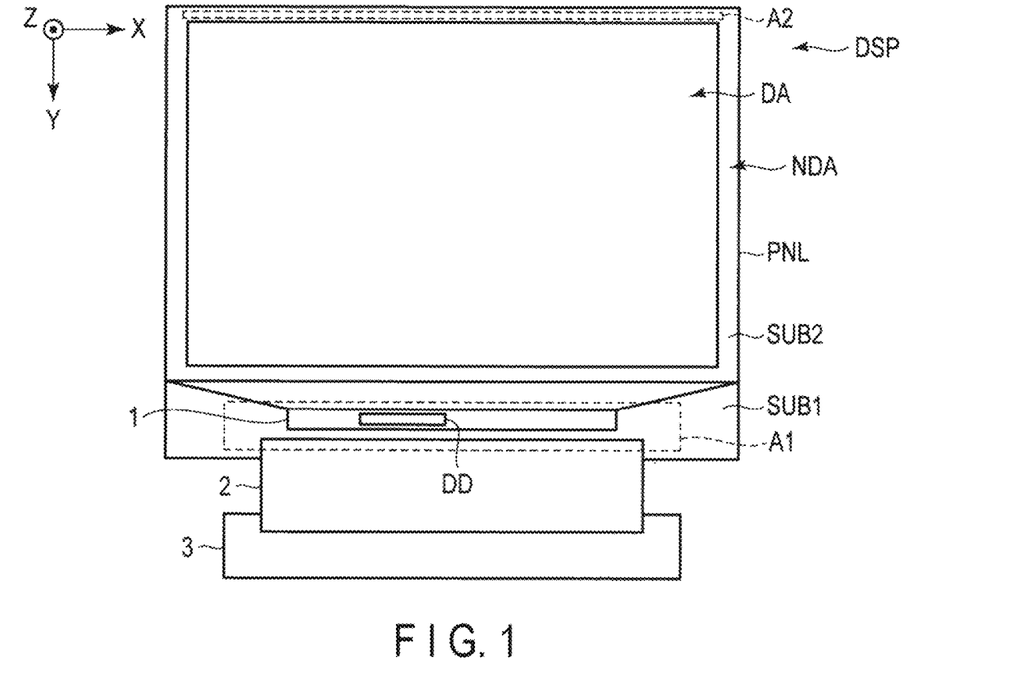
FIG. 1 is a view showing the structure of a display device DSP of the present embodiment.

FIG. 1 is a view showing the structure of a display device DSP of the present embodiment. In one example, while a first direction X, a second direction Y, and a third direction Z are orthogonal to one another, they may cross one another at an angle other than ninety degrees. The first direction X and the second direction Y correspond to directions parallel to a substrate main surface which constitutes the display device DSP, and the third direction Z corresponds to a thickness direction of the display device DSP. In the present specification, a direction toward a pointing end of an arrow indicating the third direction Z is referred to as above, and a direction toward the opposite side from the pointing end of the arrow is referred to as below. When such expressions as "a second member above a first member" and "a second member below a first member" are used, the second member may be in contact with the first member or may be separated from the first member. Further, it is assumed that an observation position at which the display device DSP is to be observed is at the pointing end side of the arrow indicating the third direction Z, and a view from the observation position toward an X-Y plane defined by the first direction X and the second direction Y is called a planar view.

The display device DSP comprises a display panel PNL, a driver IC 1, a flexible printed circuit 2, and a circuit board 3.

The display panel PNL is, for example, a liquid crystal panel, and includes a first substrate SUB1, a second substrate SUB2, and a liquid crystal layer LC which will be described later. The display panel PNL includes a display portion DA in which an image is displayed, and a frame-shaped non-display portion NDA surrounding the display portion DA. The display portion DA is provided at an area where the first substrate SUB1 and the second substrate SUB2 overlap one another. The non-display portion NDA includes a first area A1 and a second area A2 shown by dotted lines in the drawing. The first area A1 is provided at a portion, which is more extended in the second direction Y than the second substrate SUB2, in the first substrate SUB1. The second area A2 is provided at a side opposite to the first area A1 in the first substrate SUB1, and overlaps the second substrate SUB2. The display portion DA is located between the first area A1 and the second area A2.

The driver IC 1 and the flexible printed circuit 2 are connected to the first area A1. The flexible printed circuit 2 is connected to the circuit board 3. Note that the driver IC 1 may be mounted on the flexible printed circuit 2 or the circuit board 3. In the driver IC 1, a display driver DD which outputs a signal necessary for displaying an image is incorporated.

The display panel PNL of the present embodiment may be a transmissive display panel having a transmissive display function of displaying an image by selectively transmitting light from a lower surface of the first substrate SUB1, a reflective display panel having a reflective display function of displaying an image by selectively reflecting light from an upper surface of the second substrate SUB2, or a transflective display panel having the transmissive display function and the reflective display function.

Further, the details of the configuration of the display panel PNL are not explained here, but the display panel PNL may have a configuration corresponding to any one of a display mode using a lateral electric field produced along the substrate main surface, a display mode using a longitudinal electric field produced along the normal of the substrate main surface, a display mode using an inclined electric field which is tilted obliquely with respect to the substrate main surface, and a display mode using an appropriate combination of the above lateral electric field, longitudinal electric field, and inclined electric field. The substrate main surface mentioned above is a surface parallel to the X-Y plane.

Figure 2:
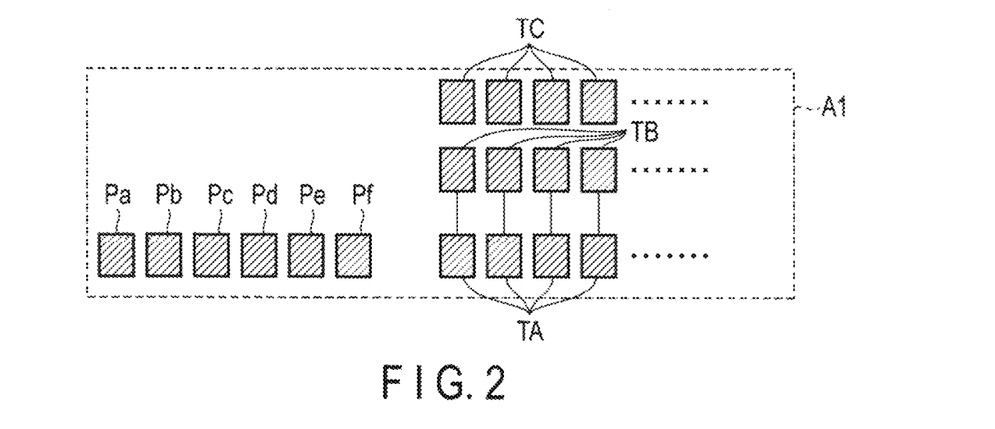
FIG. 2 is an enlarged plan view of a first area A1.

FIG. 2 is an enlarged plan view of the first area A1. Note that in FIG. 2, illustration of the driver IC 1 and the flexible printed circuit 2 is omitted.

The first area A1 comprises connection terminals TA, TB, and TC, and terminals Pa, Pb, Pc, Pd, Pe, and Pf. The connection terminals TA are connected to the flexible printed circuit 2. The connection terminals TB are electrically connected to the connection terminals TA. The connection terminals TB and the connection terminals TC are connected to the driver IC 1. The connection terminals TB mainly correspond to input terminals (or first connection terminals) for inputting various signals from the connection terminals TA (or the flexible printed circuit 2) to the driver IC 1. The connection terminals TC mainly correspond to output terminals (or second connection terminals) for supplying various signals output from the driver IC 1 to conductive lines (which may hereinafter be simply referred to as lines), etc., of the display panel.

The terminals Pa to Pf are terminals for supplying a potential from outside, and correspond to inspection terminals used in the inspection of a break, etc., of the line, or aging terminals used in the aging of the line. Each of the terminals Pa to Pf is connected to a probe of an inspection device or a probe of an aging device. Details of the terminals Pa to Pf will be described later.

Figure 3:
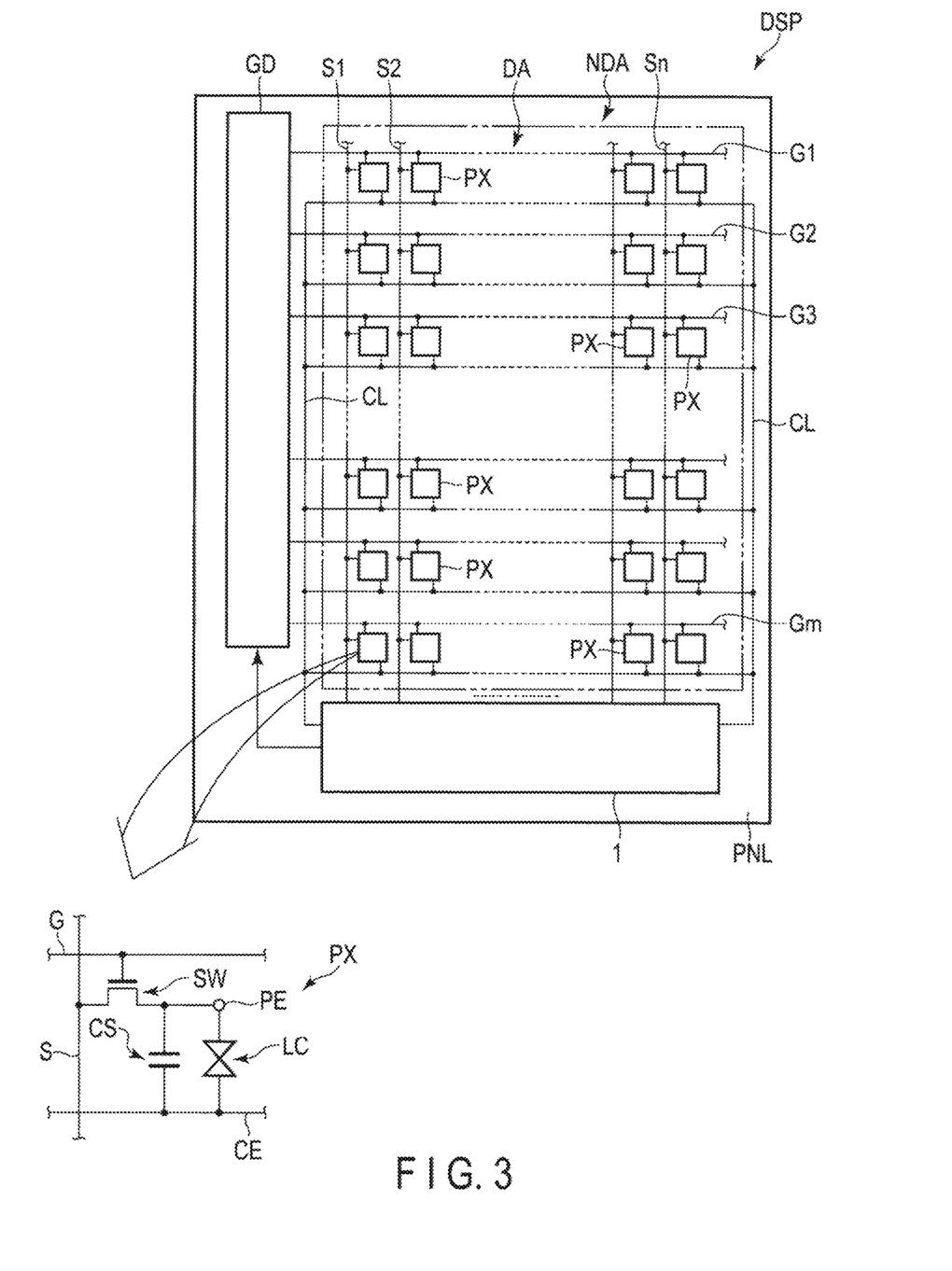
FIG. 3 is illustration showing a configuration example of a display panel PNL shown in FIG. 1.

FIG. 3 is an illustration showing a configuration example of the display panel PNL shown in FIG. 1. The display panel PNL includes pixels PX in the display portion DA. The pixels PX are arrayed in a matrix. Also, the display panel PNL includes m scanning lines G (G1 to Gm), n signal lines S (S1 to Sn), a common line CL, in the display portion DA. Note that each of m and n is an integer greater than or equal to 2. The scanning lines G are connected to a gate driver GD. A signal necessary for operating the gate driver GD is supplied from the driver IC 1. The signal lines S and the common line CL are connected to the driver IC 1. The scanning lines G, the gate driver GD, the signal lines S, and the common line CL are formed on the first substrate SUB1 shown in FIG. 1.

Each of the pixels PX comprises a switching element SW, a pixel electrode PE, a common electrode CE, the liquid crystal layer LC, and the like. The switching element SW is constituted by a thin-film transistor (TFT), for example, and is electrically connected to the scanning line G and the signal line S. The pixel electrode PE is electrically connected to the switching element SW. The common electrode CE is electrically connected to the common line CL.

The gate driver GD outputs, to the scanning line G, a control signal for setting the switching element SW connected to the scanning line G to be conductive. The driver IC 1 outputs a video signal to the signal line S during a period in which the switching element SW is conductive. A desired pixel potential is thereby written to the pixel electrode PE. Also, the driver IC 1 supplies a common potential to the common line CL. The common electrode CE is thereby set at the common potential. In each of the pixels PX, each pixel electrode PE is opposed to the common electrode CE, and the liquid crystal layer LC is driven by an electric field produced by a potential difference between the pixel potential of the pixel electrode PE and the common potential of the common electrode CE. A storage capacitance CS is formed between, for example, an electrode having the same potential as that of the common electrode CE and an electrode having the same potential as that of the pixel electrode PE.

Figure 4:
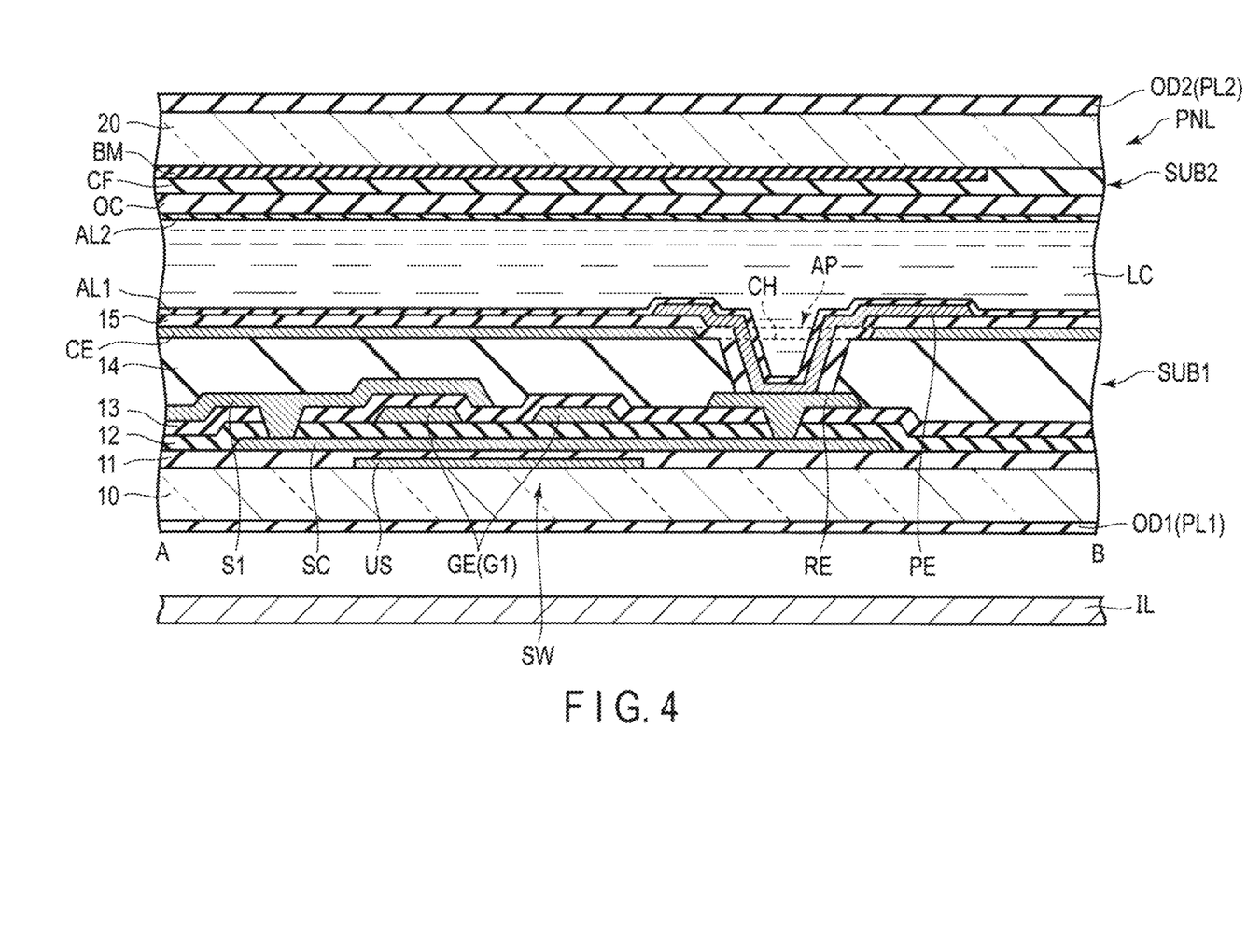
FIG. 4 is a cross-sectional view showing the structure of a display portion of the display panel PNL shown in FIG. 1.

FIG. 4 is a cross-sectional view showing the structure of the display portion of the display panel PNL shown in FIG. 1. Note that the illustrated example corresponds to a case where a fringe field switching (FFS) mode, which is one of display modes using the lateral electric field, is applied.

The first substrate SUB1 comprises an insulating substrate 10, insulating layers 11 to 15, a lower light-shielding layer US, a semiconductor layer SC, the scanning line G1, the signal line S1, a connection electrode RE, the common electrode CE, the pixel electrode PE, and an alignment film AL1. The insulating substrate 10 is a transparent substrate such as a glass substrate or a resin substrate. The lower light-shielding layer US is located between the insulating substrate 10 and the insulating layer 11. Although the lower light-shielding layer US is formed to be continuous to overlap both gate electrodes in the example illustrated, the lower light-shielding layer US may be formed separately at each of the gate electrodes. The semiconductor layer SC is located between the insulating layer 11 and the insulating layer 12. The semiconductor layer SC is formed of, for example, polycrystalline silicon, but may be formed of amorphous silicon or an oxide semiconductor. The two gate electrodes GE, which are parts of the scanning line G1, are located between the insulating layer 12 and the insulating layer 13. The signal line S1 and the connection electrode RE are located between the insulating layer 13 and the insulating layer 14. Each of the signal line S1 and the connection electrode RE is in contact with the semiconductor layer SC. The common electrode CE is located between the insulating layer 14 and the insulating layer 15. The pixel electrode PE is located between the insulating layer 15 and the alignment film AL1. A part of the pixel electrode PE is opposed to the common electrode CE via the insulating layer 15. The common electrode CE and the pixel electrode PE are formed of a transparent conductive material such as indium tin oxide (ITO) or indium zinc oxide (IZO). The pixel electrode PE is in contact with the connection electrode RE through a contact hole CH penetrating the insulating layers 14 and 15 at a position overlapping an aperture AP of the common electrode CE. Note that each of the insulating layers 11 to 13 and the insulating layer 15 is a transparent inorganic insulating layer made of, for example, silicon oxide, silicon nitride, or silicon oxynitride, and may have a single-layer structure or a multilayer structure. The insulating layer 14 is a transparent organic insulating layer made of acrylic resin, etc.

The second substrate SUB2 comprises an insulating substrate 20, a light-shielding layer BM, a color filter layer CF, an overcoat layer OC, and an alignment film AL2. The insulating substrate 20 is a transparent substrate such as a glass substrate or a resin substrate. The light-shielding layer BM and the color filter layer CF are located between the insulating substrate 20 and the overcoat layer OC. The alignment film AL2 covers the overcoat layer OC.

The liquid crystal layer LC is located between the first substrate SUB1 and the second substrate SUB2, and is held between the alignment film AL1 and the alignment film AL2. The liquid crystal layer LC is composed of a liquid crystal material of a positive type (positive dielectric anisotropy) or a negative type (negative dielectric anisotropy).

An optical element OD1 including a polarizer PL1 is disposed below the first substrate SUB1. An optical element OD2 including a polarizer PL2 is disposed above the second substrate SUB2. Note that each of the optical element OD1 and the optical element OD2 may include a retardation film, a scattering layer, an antireflective layer, and the like, as needed. An illumination device IL is located below the optical element OD1.

Next, an aging process of aging various lines provided in the display panel PNL will be explained. The lines to be aged are, for example, the signal lines S, the scanning lines G, and the common line CL shown in FIG. 2, but the other types of lines may also be aged. In each of the following configuration examples, a case where the signal line S is the line to be aged will be explained.

Figure 5:
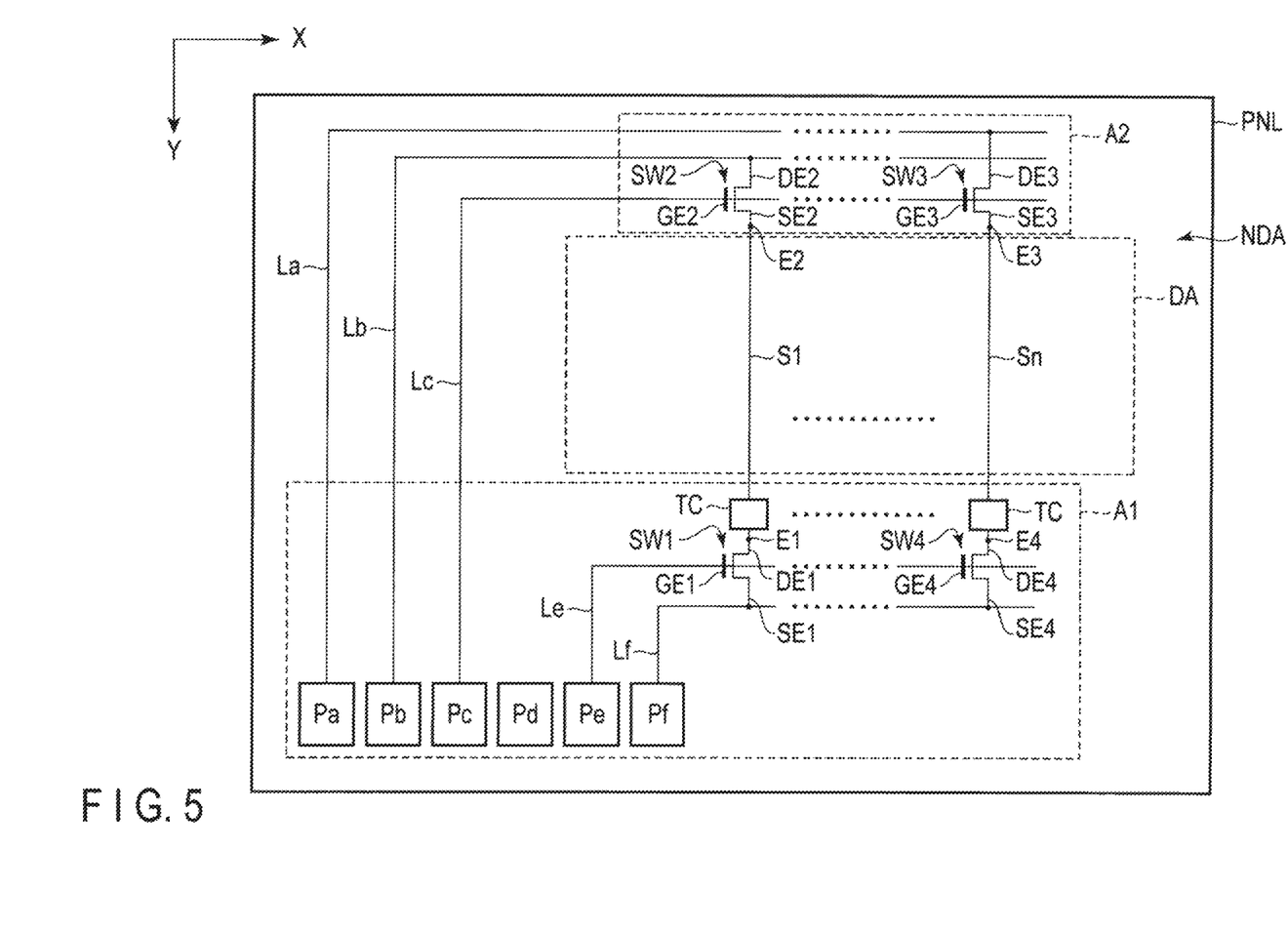
FIG. 5 is an illustration showing the display panel PNL of a first configuration example of the present embodiment.

FIG. 5 is an illustration showing the display panel PNL of a first configuration example of the present embodiment. The signal lines S (S1 to Sn) are all arranged over the display portion DA, and extend in the second direction Y. One end portion of each of the signal lines S is located in the first area A1, and the other end portion of each of the signal lines S is located in the second area A2. Here, the signal line S1 is referred to as a first line, and the signal line Sn is referred to as a second line. The first line S1 includes a first end portion E1 and a second end portion E2 in the non-display portion NDA. The second line Sn includes a third end portion E3 and a fourth end portion E4 in the non-display portion NDA. In the example illustrated, the first end portion E1 and the fourth end portion E4 are located in the first area A1, and the second end portion E2 and the third end portion E3 are located in the second area A2.

Also, the first line S1 comprises the connection terminal TC connected to the driver IC 1 shown in FIG. 1, in the first area A1. In the example illustrated, the connection terminal TC is located closer to the display portion DA than the first end portion E1. The other signal lines such as the second line Sn similarly comprise the connection terminals TC, respectively.

A first switch SW1 and a fourth switch SW4 are located in the first area A1. A second switch SW2 and a third switch SW3 are located in the second area A2. The first switch SW1 is electrically connected to the first end portion E1. The second switch SW2 is electrically connected to the second end portion E2. The third switch SW3 is electrically connected to the third end portion E3. The fourth switch SW4 is electrically connected to the fourth end portion E4. The first switch SW1 to the fourth switch SW4 are each composed of an n-channel MOS transistor, for example.

Peripheral lines La, Lb, and Lc are provided in the non-display portion NDA extending from the first area A1 to the second area A2. In the first area A1, the peripheral lines La to Lc are connected to the terminals Pa to Pc, respectively. Peripheral lines Le and Lf are provided in the first area A1, and are connected to the terminals Pe and Pf, respectively. Here, the terminal Pf is referred to as a first terminal, the terminal Pb is referred to as a second terminal, and the terminal Pa is referred to as a third terminal.

The first terminal Pf is electrically connected to the first end portion E1 via the first switch SW1. More specifically, a source electrode SE1 of the first switch SW1 is connected to the first terminal Pf via the peripheral line Lf, and a drain electrode DE1 of the first switch SW1 is connected to the first end portion E1. A gate electrode GE1 of the first switch SW1 is connected to the terminal Pe via the peripheral line Le.

The second terminal Pb is electrically connected to the second end portion E2 via the second switch SW2. More specifically, the source electrode SE2 of the second switch SW2 is connected to the second end portion E2, and the drain electrode DE2 of the second switch SW2 is connected to the second terminal Pb via the peripheral line Lb. A gate electrode GE2 of the second switch SW2 is connected to the terminal Pc via the peripheral line Lc.

Note that the source electrode SE in the above can be rephrased as a drain electrode, and the drain electrode DE in the above can be rephrased as a source electrode.

The third terminal Pa is electrically connected to the third end portion E3 via the third switch SW3. More specifically, a source electrode SE3 of the third switch SW3 is connected to the third end portion E3, and a drain electrode DE3 of the third switch SW3 is connected to the third terminal Pa via the peripheral line La. A gate electrode GE3 of the third switch SW3 is connected to the terminal Pc via the peripheral line Lc.

The first terminal Pf is electrically connected to the fourth end portion E4 via the fourth switch SW4. More specifically, a source electrode SE4 of the fourth switch SW4 is connected to the first terminal Pf via the peripheral line Lf, and a drain electrode DE4 of the fourth switch SW4 is connected to the fourth end portion E4. A gate electrode GE4 of the fourth switch SW4 is connected to the terminal Pe via the peripheral line Le.

Control signals for controlling the first switch SW1 and the fourth switch SW4 to be conductive or nonconductive are supplied to the terminal Pe. Control signals for controlling the second switch SW2 and the third switch SW3 to be conductive or nonconductive are supplied to the terminal Pc.

The first terminal Pf is set at a first potential, the second terminal Pb is set at a second potential, and the third terminal Pa is set at a third potential. The first to third potentials in the aging process are different from each other. The first to third potentials will be explained in more detail.

Figure 6:
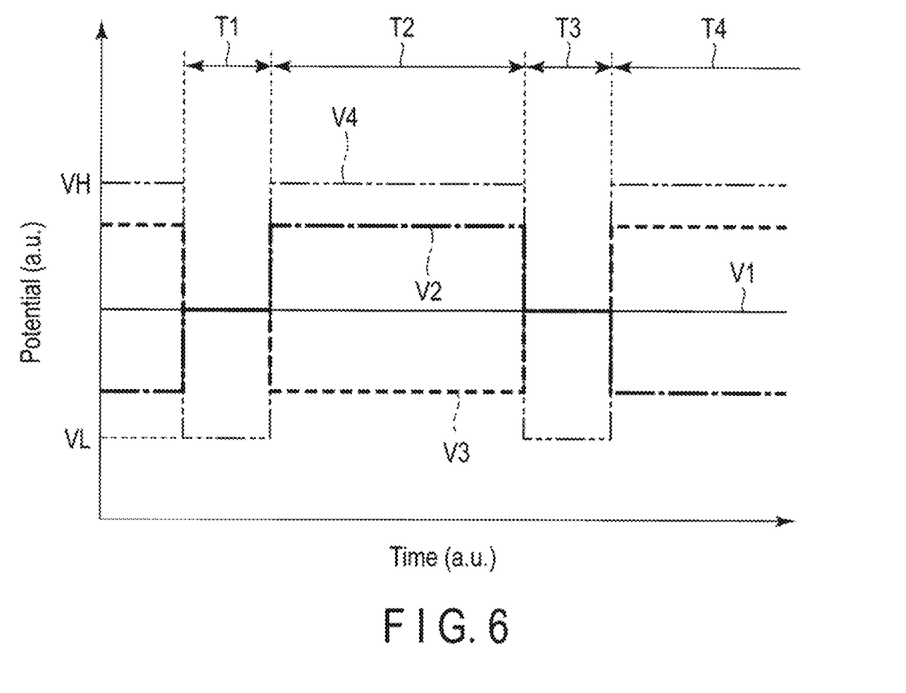
FIG. 6 is an illustration showing an example of a potential of terminal in an aging process.

FIG. 6 is an illustration showing an example of a potential of the terminal in the aging process.

A potential V1 is indicated by a solid line, and corresponds to the first potential supplied to the first terminal Pf. A potential V2 is indicated by a one-dot chain line, and corresponds to the second potential supplied to the second terminal Pb. A potential V3 is indicated by a dotted line, and corresponds to the third potential supplied to the third terminal Pa. A potential V4 is indicated by a two-dot chain line, and corresponds to a potential supplied to the terminals Pc and Pe. In the example illustrated, in periods T1 and T3 in which the potential V4 corresponds to a low potential VL, the first to fourth switches SW1 to SW4 are in a nonconductive state. Also, in periods T2 and T4 in which the potential V4 corresponds to a high potential VH higher than the low potential VL, the first to fourth switches SW1 to SW4 are in a conductive state. As described above, in an example in which conduction and nonconduction of all of the first to fourth switches SW1 to SW4 are controlled simultaneously, the peripheral lines Lc and Le shown in FIG. 5 may be connected to the same terminal (for example, the terminal Pc). Note that in a module state where a finished product is on the market, the high potential VH is not supplied to the first to fourth switches SW1 to SW4, and all of the first to fourth switches SW1 to SW4 are maintained to be nonconductive. In the aging process, the potential V4 may be the high potential VH that is constant throughout the periods T1 to T4. In other words, in the aging process, as a result of the high potential VH being supplied to the first to fourth switches SW1 to SW4 continuously, the first to fourth switches SW1 to SW4 may be constantly conductive.

A first potential V1 is a constant fixed potential during periods T1 and T3 in which the potential V4 corresponds to the low potential VL, and during periods T2 and T4 in which the potential V4 corresponds to the high potential VH. As the first potential V1 is supplied from the first terminal Pf, the first end portion E1 and the fourth end portion E4 shown in FIG. 5 are set at the first potential V1.

The second potential V2 and the third potential V3 are potentials which are changed in a pulselike manner. Moreover, the third potential V3 is a potential which is changed in a pulselike manner and is opposite in polarity to the second potential V2. For example, the second potential V2 is the same as the first potential V1 during periods T1 and T3, is higher than the first potential V1 during period T2, and is lower than the first potential V1 during period T4. The third potential V3 is the same as the first potential V1 during periods T1 and T3, is lower than the first potential V1 during period T2, and is higher than the first potential V1 during period T4. As the second potential V2 is supplied from the second terminal Pb, the second end portion E2 shown in FIG. 5 is set at the second potential V2. Similarly, as the third potential V3 is supplied from the third terminal Pa, the third end portion E3 shown in FIG. 5 is set at the third potential V3.

When the first line S1 is focused, during periods T2 and T4 in which a voltage of |V2−V1| corresponding to the absolute value of a difference between the first potential V1 of the first end portion E1 and the second potential V2 of the second end portion E2 is applied, a direct current flows in the first line S1. Similarly, when the second line Sn is focused, during periods T2 and T4 in which a voltage of |V3−V1| corresponding to the absolute value of a difference between the first potential V1 of the fourth end portion E4 and the third potential V3 of the third end portion E3 is applied, a direct current flows in the second line Sn. The magnitude of the second potential V2 and the third potential V3 can be selected as appropriate. Further, the voltage of |V2−V1| and the voltage of |V3−V1| are greater than zero, and are greater than the maximum voltage in a range of voltages of a video signal supplied to the signal line S in a module state, in one example.

Meanwhile, when the display panel PNL is subjected to a lighting inspection, normally, a voltage corresponding to the video signal is applied to each signal line S. For example, in the lighting inspection, when the first switch SW1 shown in FIG. 5 is brought to be nonconductive, and the second SW2 is brought to be conductive, and then a voltage corresponding to the video signal is applied from the second terminal Pb, a charge-discharge current flows to a capacitance which is parasitic on the first line S1. However, such a charge-discharge current is not so large as to cause a break in a line which is narrowed locally within a short time.

According to a first configuration example of the present embodiment, in order to enable a direct-current voltage to be applied to an inspection target line for a certain period, terminals for power feeding are connected to both ends of this line, and moreover, two or more switches for enabling selection of whether to apply a voltage of each of the terminals to the line are provided. Thus, even if a part which is nearly broken is formed in a line as a result of the line being thinned unintentionally in the process of forming the line, by passing a direct current in the line in the aging process, the line in question is completely broken by that stress. A risk of having occurrence of a break after a finished product is put on the market can be thereby reduced, and reduction of reliability can be prevented.

Also, in the aging process, by passing a direct current in a line, a large current can be passed in the line which has been extremely thinned locally. Thus, aging time can be reduced. Consequently, it is possible to improve efficiency of selecting a panel which is feared to have occurrence a break. Further, since such panels can be selected by the aging process at an early stage of a panel manufacturing process, a process cost can be suppressed.

Furthermore, in one example, the aging process is carried out before the lighting inspection of the display panel. Consequently, in the aging process, even if a voltage greater than the maximum voltage in a range of voltages of the video signal is applied to the line, and a large current flows, as the potential on one end side of the line is changed in a pulselike manner relative to the potential on the other end side, burn-in of the liquid crystal layer LC can be prevented.

Note that in the first configuration example shown in FIG. 5, the signal lines S1 and Sn located on both ends of the display portion DA have been referred to as the first line and the second line, respectively. However, the explanation is not restrictively applied to this example. For example, the signal lines S1 and S2 adjacent to each other in the first direction X may be referred to as the first line and the second line, respectively, and the second end portion E2 of the first line S1 may be supplied with the second potential V2 from the second terminal Pb via the second switch SW2, and the third end portion E3 of the second line S2 may be supplied with the third potential V3 from the third terminal Pa via the third switch SW3. In other words, in the aging process, the two adjacent lines may be supplied with the second potential V2 and the third potential V3 whose polarities are opposite to each other.

Figure 7:
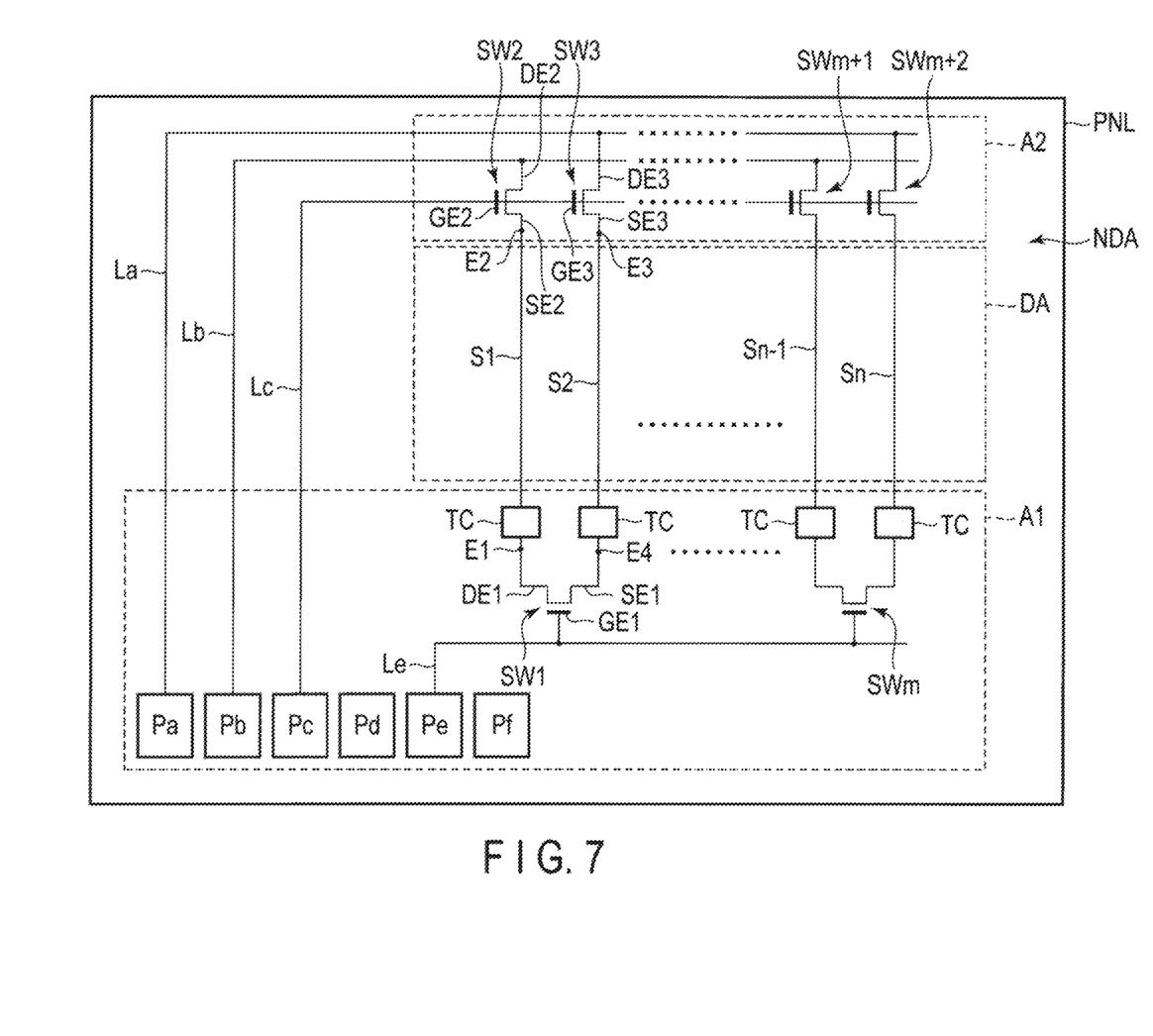
FIG. 7 is an illustration showing the display panel PNL of a second configuration example of the present embodiment.

FIG. 7 is an illustration showing the display panel PNL of a second configuration example of the present embodiment. The illustrated second configuration example is different from the first configuration example shown in FIG. 5 in that the first switch SW1 is electrically connected to two signal lines. In the example illustrated, the first switch SW1 is electrically connected to two adjacent signal lines S1 and S2. Note that the two signal lines that are electrically connected to the first switch SW1 need not be adjacent to each other. Here, the signal line S1 is referred to as the first line, the signal line S2 is referred to as the second line, the terminal Pa is referred to as the first terminal, and the terminal Pb is referred to as the second terminal.

The first line S1 includes the first end portion E1 and the second end portion E2, and the second line S2 includes the third end portion E3 and the fourth end portion E4. The first switch SW1, the first end portion E1, and the fourth end portion E4 are located in the first area A1. The second switch SW2, the third switch SW3, the second end portion E2, and the third end portion E3 are located in the second area A2.

The first switch SW1 is electrically connected to the first end portion E1 and the fourth end portion E4. In other words, the fourth end portion E4 is electrically connected to the first end portion E1 via the first switch SW1. The source electrode SE1 of the first switch SW1 is connected to the fourth end portion E4, and the drain electrode DE1 of the first switch SW1 is connected to the first end portion E1. The gate electrode GE1 of the first switch SW1 is connected to the terminal Pe via the peripheral line Le.

The second switch SW2 is electrically connected to the second end portion E2. The second terminal Pb is electrically connected to the second end portion E2 via the second switch SW2. More specifically, the source electrode SE2 of the second switch SW2 is connected to the second end portion E2, and the drain electrode DE2 of the second switch SW2 is connected to the second terminal Pb via the peripheral line Lb. The gate electrode GE2 of the second switch SW2 is connected to the terminal Pc via the peripheral line Lc.

The third switch SW3 is electrically connected to the third end portion E3. The first terminal Pa is electrically connected to the third end portion E3 via the third switch SW3. More specifically, the source electrode SE3 of the third switch SW3 is connected to the third end portion E3, and the drain electrode DE3 of the third switch SW3 is connected to the first terminal Pa via the peripheral line La. The gate electrode GE3 of the third switch SW3 is connected to the terminal Pc via the peripheral line Lc.

Note that the source electrode SE in the above can be rephrased as a drain electrode, and the drain electrode DE in the above can be rephrased as a source electrode.

The potential V4 shown in FIG. 6 is supplied to each of the terminals Pc and Pe. Also, the potential V2 corresponds to the first potential supplied to the first terminal Pa. The potential V3 corresponds to the second potential supplied to the second terminal Pb.

In a period in which the first to third switches SW1 to SW3 are conductive (or a period in which the potential V4 corresponds to the high potential VH), as the first potential V2 is supplied from the first terminal Pa, the third end portion E3 is set at the first potential V2. Also, in this period, as the second potential V3 is supplied from the second terminal Pb, the second end portion E2 is set at the second potential V3. When the first potential V2 is higher than the second potential V3, a voltage of |V2−V3| corresponding to the absolute value of a difference between the first potential V2 of the third end portion E3 and the second potential V3 of the second end portion E2 is applied, and a direct current flows in the first line S1 and the second line S2.

Note that signal lines Sn−1 and Sn are electrically connected to switches SWm in the first area A1, respectively. Also, in the second area A2, the signal line Sn−1 is electrically connected to a switch SWm+1, and the signal line Sn is electrically connected to a switch SWm+2.

According to the second configuration example as described above, the same advantages as those of the first configuration example can be obtained. In addition, a direct current can be passed in a route passing two signal lines, and the number of peripheral lines and terminals can be reduced as compared to the first configuration example.

Figure 8:
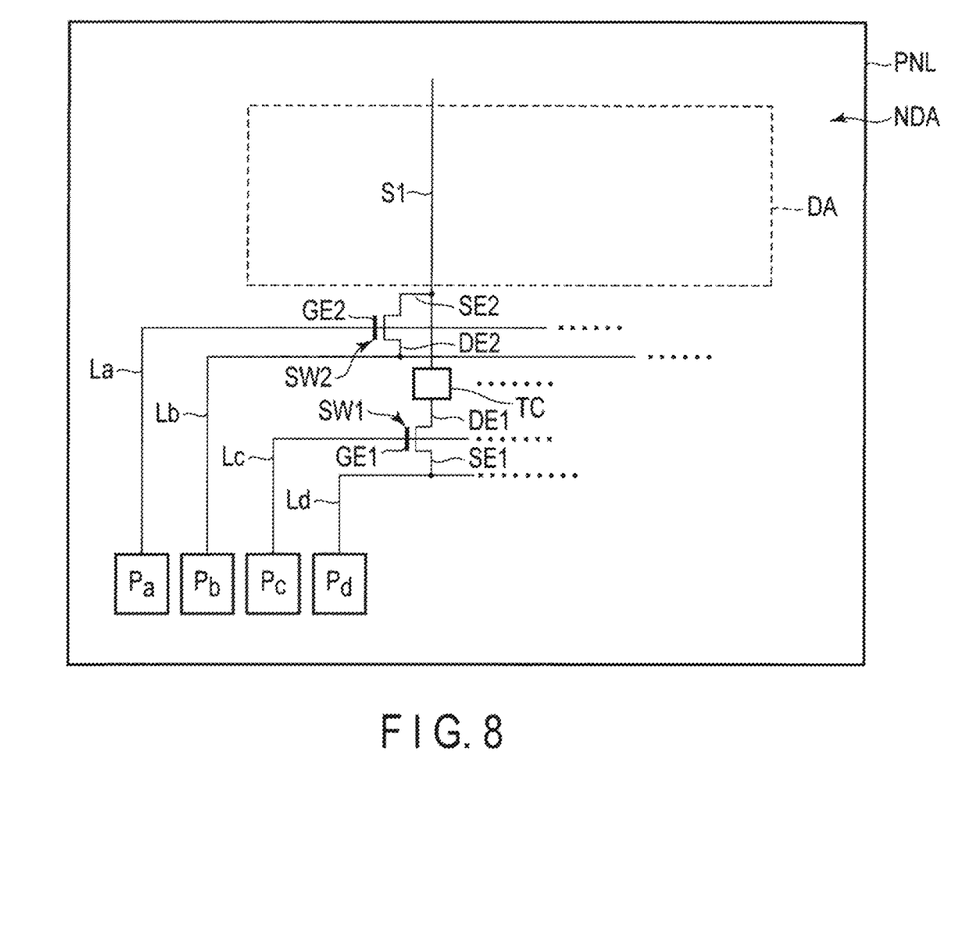
FIG. 8 is an illustration showing the display panel PNL of a third configuration example of the present embodiment.

FIG. 8 is an illustration showing the display panel PNL of a third configuration example of the present embodiment. The illustrated third configuration example is different from the first configuration example shown in FIG. 5 in that the first switch SW1 and the second switch SW2 are connected in series in the non-display portion NDA. The source electrode SE1 of the first switch SW1 is connected to the terminal Pd via the peripheral line Ld, and the drain electrode DE1 of the first switch SW1 is connected to the connection terminal TC. The gate electrode GE1 of the first switch SW1 is connected to the terminal Pc via the peripheral line Lc. The source electrode SE2 of the second switch SW2 is connected to the signal line S1 in the non-display portion NDA, and the drain electrode DE2 of the second switch SW2 is connected to the terminal Pb via the peripheral line Lb. The gate electrode GE2 of the second switch SW2 is connected to the terminal Pa via the peripheral line La.

According to the third configuration example described above, an aging process can be performed for a section of the signal line S1 between a portion where the signal line S1 is connected to the source electrode SE2 and the connection terminal TC, in particular, which constitutes a lead for establishing connection with the driver IC 1.

Figure 9:
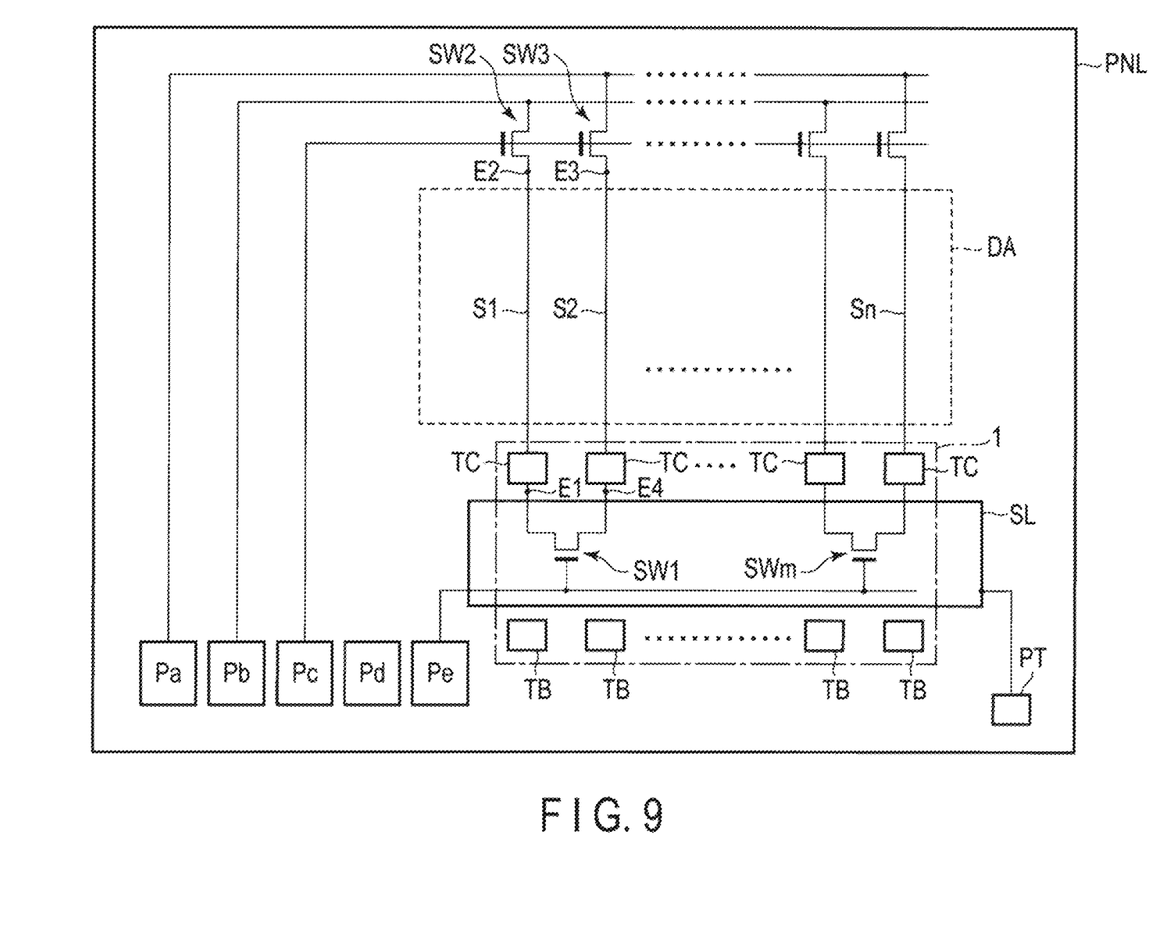
FIG. 9 is an illustration showing the display panel PNL of a fourth configuration example of the present embodiment.

FIG. 9 is an illustration showing the display panel PNL of a fourth configuration example of the present embodiment. The illustrated fourth configuration example is different from each of the above configuration examples in that a shielding electrode SL covering the first switch SW1 is provided. The shielding electrode SL is arranged between the connection terminals TB and the connection terminals TC. Also, when the driver IC 1 shown by a one-dot chain line in the drawing is connected to the connection terminals TB and TC, the shielding electrode SL is located between the switches SW1 to SWm and the driver IC 1. Although the potential of the shielding electrode SL is a fixed potential such as the common potential, it may be ground potential. In the example illustrated, the shielding electrode SL is connected to a power terminal PT at the common potential. The power terminal PT may be the connection terminal TC connected to the driver IC 1, or may be the connection terminal TA connected to the flexible printed circuit 2.

Further, the power terminal PT may be electrically connected to lines at the fixed potential such as the common line CL.

Note that the fourth configuration example is applicable to the above first to third configuration examples. More specifically, in the first configuration example shown in FIG. 5, the shielding electrode SL covers the first switch SW1 and the fourth switch SW4. In the second configuration example shown in FIG. 7, the shielding electrode SL covers the first switch SW1 and the switch SWm. In the third configuration example shown in FIG. 8, the shielding electrode SL covers the first switch SW1 and the second switch SW2.

Figure 10:
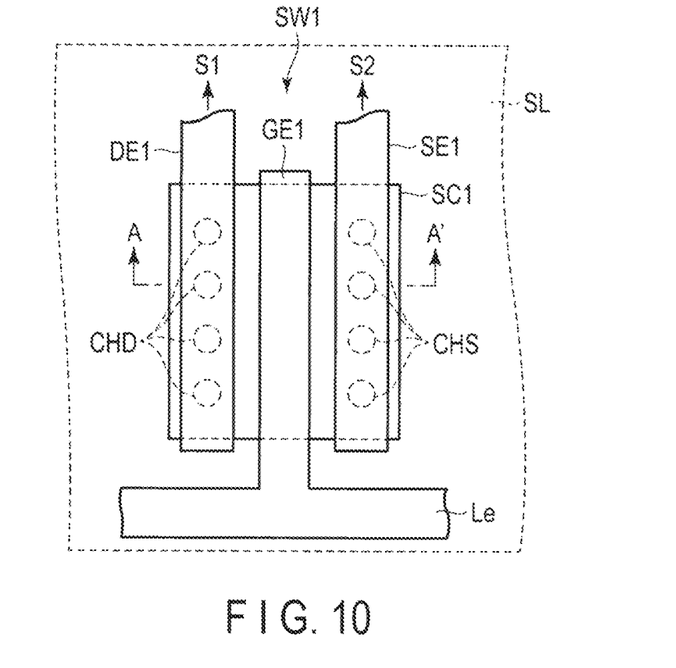
FIG. 10 is a plan view showing a shielding electrode SL and a first switch SW1 shown in FIG. 9.

FIG. 10 is a plan view showing the shielding electrode SL and the first switch SW1 shown in FIG. 9. The gate electrode GE1 is formed integrally with the peripheral line Le. Further, the gate electrode GE1 is located between the drain electrode DE1 and the source electrode SE1. The drain electrode DE1 is not only connected to the signal line S1, but is also in contact with a semiconductor layer SC1 through a contact hole CHD. The source electrode SE1 is not only connected to the signal line S2, but is also in contact with the semiconductor layer SC1 through a contact hole CHS. The shielding electrode SL overlaps the peripheral line Le and the first switch SW1 as shown by a dotted line in the drawing.

Figure 11:
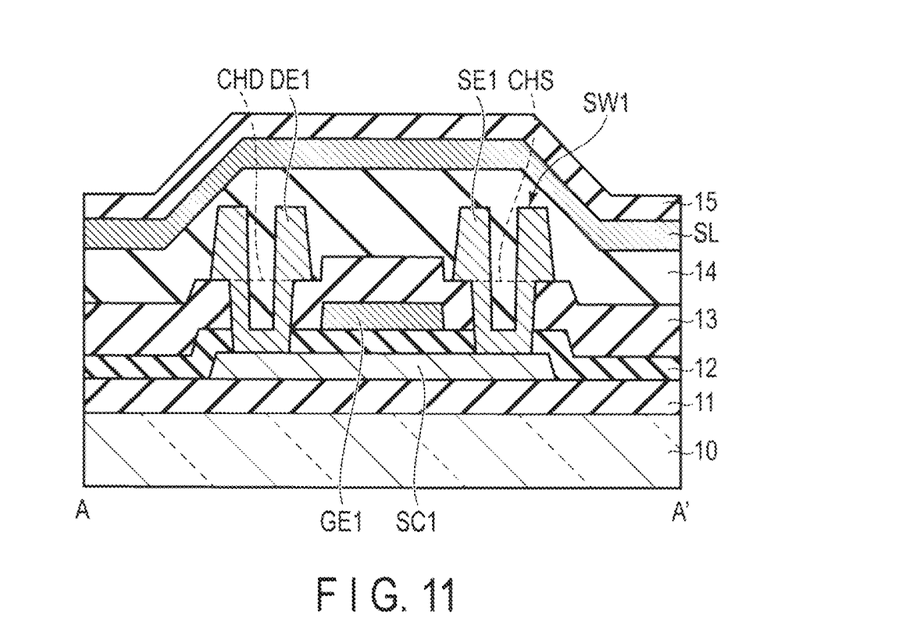
FIG. 11 is a cross-sectional view of the shielding electrode SL and the first switch SW1 taken along line A-A' of FIG. 10.

FIG. 11 is a cross-sectional view of the shielding electrode SL and the first switch SW1 taken along line A-A' of FIG. 10. The semiconductor layer SC1 is located between the insulating layer 11 and the insulating layer 12. The gate electrode GE1 is located between the insulating layer 12 and the insulating layer 13. The contact holes CHS and CHD penetrate the insulating layers 12 and 13 to the semiconductor layer SC1. The source electrode SE1 and the drain electrode DE1 are located between the insulating layer 13 and the insulating layer 14, and are in contact with the semiconductor layer SC1 through the contact holes CHS and CHD, respectively. The shielding electrode SL is located on the insulating layer 14, and is covered with the insulating layer 15. The insulating layer 14 located between the first switch SW1 and the shielding electrode SL is an organic insulating layer. In the example illustrated, the shielding electrode SL is located in the same layer as the common electrode CE shown in FIG. 4, and is formed of a transparent conductive material, which is the same material as that used for the common electrode CE. The insulating layer 15 functions as a protective layer which protects the shielding electrode SL. Note that the shielding electrode SL may be located on the insulating layer 15, and may be formed of the same material as that of the pixel electrode PE. Also, the shielding electrode SL may be formed of a metal material.

According to the fourth configuration example, the drain electrode DE1 and the source electrode SE1 of the first switch SW1 are connected to the signal lines S1 and S2, respectively. However, the first switch SW1 is covered by the shielding electrode SL. Thus, since a ripple noise of the signal lines S1 and S2 is shielded by the shielding electrode SL, transmission of the ripple noise to the driver IC 1 is suppressed. Accordingly, a malfunction of the driver IC 1 caused by the ripple noise can be suppressed.

Also, the insulating layer 14 located between the first switch SW1 and the shielding electrode SL is an organic insulating layer, and has a greater film thickness as compared to the insulating layers 11 to 13. For this reason, as compared to a case where a thin insulating layer is located between the first switch SW1 and the shielding electrode SL, a ripple noise shielding effect can further be enhanced.

Also, since the shielding electrode SL is covered with the insulating layer 15 as a protective layer, electric insulation from the driver IC 1 mounted above the shielding electrode SL is secured.

As explained above, according to the present embodiment, it is possible to provide a display device for which lowering of the reliability is suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a first line which is arranged across a display portion, and includes a first end portion and a second end portion located at a non-display portion such that the display portion is located between the first end portion and the second end portion;
a second line which is adjacent to the first line, and includes a third end portion and a fourth end portion located at the non-display portion such that the display portion is located between the third end portion and the fourth end portion;
a first switch configured to electrically connect the first end portion and the fourth end portion;
a second switch electrically connected to the second end portion;
a third switch electrically connected to the third end portion;
a first terminal electrically connected to the third end portion via the third switch;
a second terminal electrically connected to the second end portion via the second switch;
an organic insulating layer disposed over the display portion and the non-display portion, and covering the first switch;
a transparent electrode disposed on the organic insulating layer in the display portion; and
a shielding electrode disposed on the organic insulating layer and overlapping the first switch, wherein
the shielding electrode is formed of a transparent conductive material, which is a same material as that used for the transparent electrode.

2. The display device of claim 1, wherein:
the first switch is located in a first area of the non-display portion;
the second switch and the third switch are located in a second area of the non-display portion; and
the display portion is located between the first area and the second area.

3. The display device of claim 2, further comprising:
a first substrate comprising the display portion, the first area, and the second area;
a second substrate overlapping the display portion and the second area; and
a driver IC connected to the first area, wherein
the first area comprises a connection terminal electrically connected to the driver IC, and the connection terminal is located between the first end portion and the display portion, and is electrically connected to the first line.

4. The display device of claim 1, wherein:
the third end portion is set at a first potential via the first terminal;
the second end portion is set at a second potential different from the first potential via the second terminal; and
the first potential and the second potential are changed in a pulselike manner in opposite polarities.

5. The display device of claim 1, wherein
a potential of the shielding electrode is a fixed potential.

6. The display device of claim 1, further comprising a protective layer covering the shielding electrode.

7. The display device of claim 1, further comprising a driver IC overlapping the shielding electrode, and a first connection terminal and a second connection terminal electrically connected to the driver IC, wherein:
the first switch and the shielding electrode are located between the first connection terminal and the second connection terminal; and
the second connection terminal is electrically connected to the first switch and the first line.

* * * * *